(12) United States Patent
Schramme et al.

(10) Patent No.: US 9,689,367 B2
(45) Date of Patent: Jun. 27, 2017

(54) DEVICE AND METHOD FOR DETERMINING THE STARTING CAPABILITY OF AN INTERNAL COMBUSTION ENGINE

(75) Inventors: Martin Schramme, Königsbrunn (DE); Horst Gering, Regensburg (DE); Wolfgang Weigert, Tegernheim (DE); Matthias Münch, Köfering (DE); Thomas Klement, Regensburg (DE); Hans-Michael Graf, Regensburg (DE); Reinhard Tendler, Grossberg (DE); Oliver Friedrichsohn, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 594 days.

(21) Appl. No.: 13/885,941

(22) PCT Filed: Nov. 17, 2011

(86) PCT No.: PCT/EP2011/070321
§ 371 (c)(1),
(2), (4) Date: Jul. 25, 2013

(87) PCT Pub. No.: WO2012/066064
PCT Pub. Date: May 24, 2012

(65) Prior Publication Data
US 2015/0345458 A1    Dec. 3, 2015

(30) Foreign Application Priority Data

Nov. 17, 2010 (DE) .................. 10 2010 044 060

(51) Int. Cl.
B60L 11/00 (2006.01)
B60W 10/08 (2006.01)
(Continued)

(52) U.S. Cl.
CPC ........ *F02N 11/108* (2013.01); *F02N 11/0825* (2013.01); *F02N 11/0862* (2013.01);
(Continued)

(58) Field of Classification Search
CPC ...... B60W 20/00; B60W 10/06; B60W 10/08; B60W 30/192; B60W 2510/0676
See application file for complete search history.

(56) References Cited

U.S. PATENT DOCUMENTS

2006/0232277 A1   10/2006 Murakami et al.
2008/0215266 A1*   9/2008 Mizuno .............. G01R 31/3662
                                                                702/63
(Continued)

FOREIGN PATENT DOCUMENTS

EP       2 138 711         12/2009
EP       2 138 711 A1      12/2009
EP       2 138 711 B1       8/2012

*Primary Examiner* — Adam Tissot
*Assistant Examiner* — Paul Castro
(74) *Attorney, Agent, or Firm* — Cozen O'Connor (57) ABSTRACT

A method for determining the starting capability of an internal combustion engine of a motor vehicle, which can be started by an electric motor powered by a battery, including detecting first battery parameter values during a successful starting sequence of the internal combustion engine at a first time, detecting second battery parameter values at a second time following the first time, determining at the second time the expected battery voltage for a starting sequence of the internal combustion engine taking place at a third time based on the detected first and second battery parameter values, and comparing the battery voltage expected at the third time with a predetermined threshold value in order to derive therefrom the starting capability of the internal combustion engine.

9 Claims, 2 Drawing Sheets

(51) Int. Cl.
*F02N 11/10* (2006.01)
*F02N 11/08* (2006.01)
*H01M 10/42* (2006.01)
G01R 31/36 (2006.01)
H01M 10/48 (2006.01)

(52) U.S. Cl.
CPC ....... *H01M 10/425* (2013.01); *G01R 31/3693* (2013.01); *H01M 10/486* (2013.01); *Y02T 10/48* (2013.01)

(56) References Cited

U.S. PATENT DOCUMENTS

2010/0154524 A1* 6/2010 Salman ............... F02N 11/0859 73/114.59
2010/0269776 A1* 10/2010 Mizuno .................. F02D 29/06 123/179.4

* cited by examiner

DEVICE AND METHOD FOR DETERMINING THE STARTING CAPABILITY OF AN INTERNAL COMBUSTION ENGINE

CROSS REFERENCE TO RELATED APPLICATIONS

This is a U.S. national stage of application No. PCT/EP2011/070321, filed on 17 Nov. 2011. Priority is claimed on German Application No. 10 2010 044 060.4 filed 17 Nov. 2010, the content of which is incorporated here by reference.

BACKGROUND OF THE INVENTION

1. Field of the Invention

The present invention relates to a device and a method for determining the starting capability of an internal combustion engine.

2. Detailed Description of Prior Art

Vehicles with a conventional internal combustion engine require a battery to stabilize the on-board power system voltage and to start the internal combustion engine. In the majority of all vehicles this is a lead acid battery, which can comprise a wide variety of embodiments.

During travel, this battery is charged by a generator driven by an internal combustion engine, and during the stationary state of the internal combustion engine the battery is discharged when the load is connected. If the battery is discharged too strongly during the stationary state, this can lead to a situation in which it is no longer possible to start the internal combustion engine.

Within the framework of reducing the $CO_2$ emission, the internal combustion engine is to be completely switched off when the vehicle is stationary (for example at a traffic light) and the battery is to be charged by the generator, in particular in the overrun mode of the internal combustion engine. This strategy tends to increase the risk of a negative charge balance of the battery, which in extreme cases can cause stranding, that is to say an inability to start the internal combustion engine.

Compared to the diagnosis of stationary batteries (for example assisting the power supply in the event of a power failure, buffering power peaks during the generation of power) there are normally no catch points, that is to say no absolutely determinable battery characteristic values for the diagnosis (for example definitively full, definitively flat, definitively in complete rest etc.) in mobile applications (passenger cars, trucks, buses and also in fork lift trucks etc.). The state of the battery usually fluctuates between 70% and 95% in the state of charge, and the current is never precisely 0 A and a temperature range from −40° C. to 90° C. is possible, wherein the temperature is usually not constant during operation.

In order to diagnose a battery, it can be described, for example, by an electric model that requires as input variables the battery current, the battery voltage, and the battery temperature. There are also solutions in which the current or the voltage is not used directly for diagnosis of the battery but instead the battery resistance is used at various frequencies. The voltage is normally measured here by an analog/digital (A/D) converter connected downstream of a voltage divider. The analog variables of the current and the temperature are firstly each changed into a voltage value which is then converted in each case by an A/D converter into a numerical value. The detection of the current is carried out indirectly across the voltage drop on a shunt resistor or by a magnetic field which is induced by the current (for example Hall effect). For the measurement of the temperature, temperature-dependent resistance materials such as positive temperature coefficient (PCT) thermistors or negative temperature coefficient (NTC) thermistors are suitable.

The voltage is ideally measured at the poles of the battery. The entire battery current, i.e. the sum of the currents of all the loads, is ideally measured directly at one of the two poles, and the temperature is ideally measured in the interior of the battery. The battery current is partially estimated from the difference between the currents of the generator and the on-board power system and/or from the battery voltage.

However, alternatively, current, voltage and/or temperature can also be measured at other positions. The resulting error must then, however, be corrected/interpolated numerically by suitable algorithms. This is done, in particular, for the temperature, which is normally measured outside the battery. The A/D conversion of all three measured values is performed frequently (for example in an intelligent battery sensor) in the spatial vicinity of the battery. The A/D conversion can, however, also take place in any desired control unit, provided that the measurement signals are sufficiently strong to be able to be transmitted as far as the control unit without interference; for example under certain circumstances the signal can be boosted in a Hall sensor.

The measurement of the current has proven to be a cost driver. For this reason, in the past there have already been approaches involving diagnosing the battery without measuring the battery current. However, the objective was mostly to estimate the state of charge or a negative charge balance at which in total the battery is discharged to a greater extent than it is charged.

However, for the determination of the state of charge of a battery methods are also conceivable which are based on measuring the acid density (visual, acoustic, inductive etc.) The acid density correlates directly to the state of charge of the battery. However, these methods have previously not become widely accepted. An exception is what is referred to as the "magic eye". The "magic eye" is embodied as a viewing window in the housing of the battery and indicates a measure of the acid content or the state of charge of the battery visually by way of color change.

However, the starting capability of the vehicle per se played only a subordinate role in this context since the driver always switched off the internal combustion engine and therefore was ultimately responsible for his own mobility. With the introduction of the start/stop system the focus of the battery diagnosis has shifted. The restarting of the vehicle at the traffic light which jumps to "green" is the core of the present discussion.

SUMMARY OF THE INVENTION

An object of one embodiment of the present invention is a simple and favorable technical solution which permits the starting capability of an internal combustion engine to be determined.

The method according to one embodiment of the invention for determining the starting capability of an internal combustion engine of a motor vehicle, which internal combustion engine can be started by an electric motor which is supplied by a battery, has the method steps:

detecting first battery parameter values during a successful starting process of the internal combustion engine at a first time,
 detecting second battery parameter values at a second time following the first time, determining, at the second time, the expected battery voltage for a starting process of the internal combustion engine which follows at a third time and is based on the detected first and second battery parameter values, comparing the battery voltage expected at the third time with a predefined threshold value in order to derive the starting capability of the internal combustion engine therefrom.

As a result, the vehicle is prevented from becoming stranded due to insufficient battery power.

In one advantageous refinement of the invention, the starting capability is present if the battery voltage expected at the third time is equal to or greater than the predefined threshold value. This has the advantage that the threshold value of the battery voltage can be adapted to the other electrical devices such as the engine control unit.

In a further advantageous refinement of the invention, an internal combustion engine that is running at the second time is stopped only if the starting capability of the internal combustion engine is present at the third time. This prevents the situation in which the motor vehicle can no longer be started after the engine is switched off.

In a further advantageous refinement of the invention, an internal combustion engine, which is stopped at the second time, is restarted if the aforementioned starting capability of the internal combustion engine is no longer present at the third time. This has the advantage that the engine is started before the necessary voltage for the starting capability is undershot.

In a further advantageous refinement of the invention, the parameters comprise the battery voltage and/or battery temperature. These are parameters for which sensors for measurement are usually already present so that there is no need for additional sensors.

In a further advantageous refinement of the invention, as a further parameter, a voltage between the negative pole of the battery and a point on the vehicle bodywork through which current flows is measured. This additional voltage serves to check the plausibility of parameters that form the basis for the prediction of the starting capability.

A second aspect of the invention comprises a device for determining the starting capability of an internal combustion engine of a motor vehicle, which can be started by an electric motor supplied by a battery, wherein the device comprises the following features:

at least one sensor:
  for detecting first battery parameter values during a successful starting process of the internal combustion engine at a first time, and
  detecting second battery parameter values at a second time following the first time, and
an evaluation unit:
  for determining, at the second time, the expected battery voltage for a starting process of the internal combustion engine which follows at a third time and is based on the detected first and second battery parameter values, and
  for comparing the battery voltage expected at the third time with a predefined threshold value in order to derive the starting capability of the internal combustion engine therefrom.

This has the advantage that as a result of the possibility of determining the starting capability of the internal combustion engine, it is possible to prevent the vehicle from becoming stranded due to a battery power which is no longer sufficient.

In one advantageous refinement of the invention, the evaluation unit is configured to actuate the at least one sensor in order to detect the first and second battery parameter values at the first and second times. As a result, the first and second battery parameter values are detected on an up-to-date basis, and the starting capability is likewise determined from up-to-date values, with the result the prediction of the starting capability is correspondingly precise.

BRIEF DESCRIPTION OF THE DRAWINGS

The invention will be explained below by way of example with reference to FIGS. 1 to 3. In a schematic form.

DETAILED DESCRIPTION OF THE PREFERRED EMBODIMENTS

Figure 1:
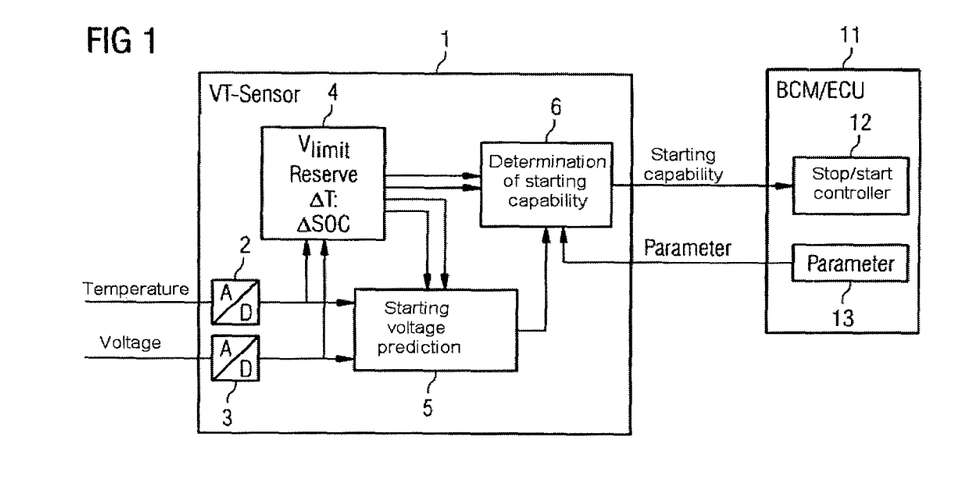
FIG. 1 is a device according to one embodiment of the invention.

FIG. 1 shows a sensor and evaluation unit 1 and an engine control unit 11. The sensor and evaluation unit 1 comprises a first A/D converter 2, which has an analog temperature signal as the input, and a second A/D converter 3 which has an analog voltage as the input. In the first and second A/D converters 2, 3, the analog input variables are converted into digital values.

The sensor and evaluation unit 1 also comprises the blocks 4, 5 and 6.

In block 4 "$V_{limit}$ Reverse $\Delta T$ $\Delta SOC$", the change in the temperature $\Delta T$ and in the state of charge $\Delta SOC$ of the battery since the last start are calculated with corresponding algorithms from the digitized temperature and voltage values.

In block 5 "starting voltage prediction", the predicted battery voltage for the next engine start is calculated from the battery voltage at the last engine start of the motor vehicle which has taken place, and the predicted battery voltage for the next engine start is calculated using the values $\Delta T$, $\Delta SOC$.

In block 6 "starting capability determination", the predicted starting voltage is compared with the battery voltage that is necessary to start the engine. The battery voltage that is necessary can be predefined as a parameter of the engine control unit 11 BCM/ECU, calculated from the battery temperature or else be a permanently predefined value. The result of the comparison is transferred as a "starting capability" parameter to the stop/start controller 12, which in turn takes the starting capability into the decision as to whether or not the engine can be switched off, automatically activates the engine, or requests the driver to start the engine.

FIG. 1 also shows an engine control unit 11 that can exchange data with the sensor and evaluation unit 1. The engine control unit 11 comprises a stop/start controller 12 and a memory unit in which parameters 13 of the stop/start controller 12 are stored.

The sensor for measuring the voltage and temperature can advantageously comprise the following components:
  a housing with a plug, and/or cable tail and/or metal clip;
  one or two analog/digital converters for changing voltages into numerical values;
  an evaluation unit (microcontroller) for calculating the starting capability and further variables;

a communication output (possibly also input) for communicating the starting capability to a superordinate control unit (for example LIN, CAN or PWM);

a temperature sensor, which generates a voltage signal (for example NTC resistor) within or outside the housing with a good thermal connection to the battery; and in each case an electrical connection of the analog input of the A/D converter to the positive pole and to the negative pole of the battery, alternatively also to two points or terminals in the on-board power system between which the battery voltage is approximately present.

The sensor can be arranged in the engine controller, in a body controller, in the battery, or as an independent electronic unit.

In addition, the sensor can be embodied in the form of a printed circuit board equipped with electronic components that is in turn installed in its entirety in a control unit of the vehicle or is mounted on a control unit printed circuit board.

Specifically, the housing could have a plug with two pins for a local interconnect network (LIN), that is to say a serial bus terminal and a terminal for the positive pole of the battery (B+). Via B+, the measurement voltage is fed in and also the power supply of the sensor is ensured. The LIN line is connected, for example, to a body controller or to the engine controller and also receives information therefrom. A metal clip which is led out of the housing connects the sensor mechanically to the negative pole of the battery and also ensures an electrical connection and the thermal coupling to the interior of the battery. Alternatively, the voltage of the negative pole can also be fed in via the plug.

The device according to the invention can also comprise further components such as, for example, a component for supplying voltage, which component makes available at the same time a high-precision reference voltage (for example 3 V). Furthermore, the device can comprise a microcontroller (µC) (for example NEC, 24 kByte ROM) that contains an A/D converter (10 to 16 bit). A voltage divider, which can reduce the battery voltage to 5 to 50% of the original voltage, can also be provided. An additional voltage divider with the reference voltage with an NTC (good electrical contact to the clip) would supply a second voltage dependent on the temperature. Both voltages would be changed by the A/D converter into numerical values and further processed by the processor. The starting capability, which is calculated by the processor, can be transferred to the superordinate control unit via a LIN terminal. All the components can be connected to one another via a printed circuit board. A lack of starting capability would then lead, in the superordinate control units, to reactions which would ensure mobility.

Specifically, the actual starting behavior can be described over time by a minimal voltage and/or duration of the starting process and/or change in the voltage (dU/dt) during the starting process and/or integration of the voltage dip. The change in the starting capability (here for example the minimum starting voltage) can be specifically calculated from an electrical model of the battery ($V_{Battery}$=f(SOC, $T_{Battery}$, $V_{Polarization}$, $R_{Starter}$, $Q_{Battery}^{max}$)) as described in the following text.

Figure 2:
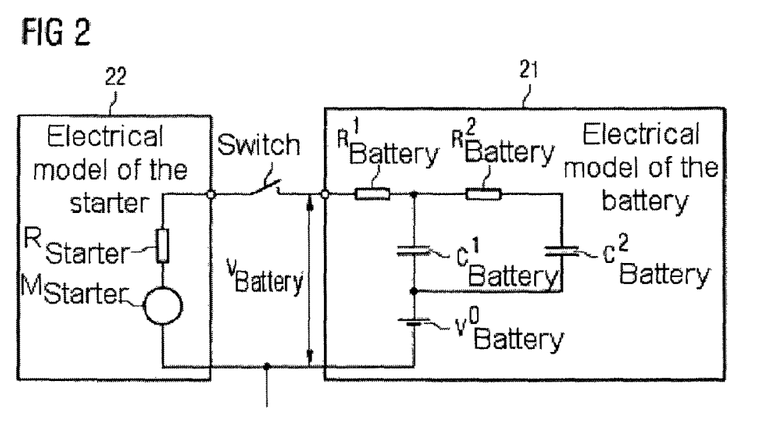
FIG. 2 is an electric model of the battery and starter.

FIG. 2 shows an electrical model of the battery 21 and of the starter 22, which can be electrically connected by a switch.

Here, $R_{starter}$ is the electrical resistance of the starter, $M_{starter}$ is the electrical motor which induces an opposing voltage at a rotational speed>0, $R_{Battery}^1$ and $R_{Battery}^2$ are two different electrical resistances within the battery, $C_{Battery}^1$ and $C_{Battery}^2$ are two different electrical capacitances within the battery and $V_{Battery}^0$ is a voltage offset within the battery. The sum of the two charge contents of the capacitors 1 and 2 ($Q_{Battery}^1$ and $Q_{Battery}^2$) divided by the maximum charge quantity $Q_{Battery}^{max}$ of the battery is usually referred to as the state of charge (SOC), $$SOC = \frac{Q_{Battery}^1 + Q_{Battery}^2}{Q_{Battery}^{MAX}}.$$

Voltage differences between the two capacitors $$V_{Battery}^1 - V_{Battery}^2 = \frac{Q_{Battery}^1}{C_{Battery}^1} - \frac{Q_{Battery}^2}{C_{Battery}^2}$$

can be referred to as a polarization voltage $$V_{Polarization} = V_{Battery}^1 - V_{Battery}^2$$

of the battery. Both the two capacitances of the battery and the two resistances depend additionally in a nonlinear fashion on the battery temperature $T_{Battery}$, and the battery voltages $V_{Battery}^1$ and $V_{Battery}^2$.

At the time t0, the variables $R_{starter}$, $R_{Battery}^1$, $R_{Battery}^2$, $C_{Battery}^1$, $C_{Battery}^2$, $V_{Battery}^0$, $Q_{Battery}^1$, $Q_{Battery}^2$, $Q_{Battery}^{max}$ and $T_{Battery}$ are assumed to be known.

If the switch between the battery and starter is then closed, the following predicted battery voltage $V_{Battery}=V_{predicted}$ then occurs in the electrical model at the time t1:

$$V_{predicted}(t_1) = \frac{V_{Battery}^1 + V_{Battery}^0}{\left(1 - \frac{R_{Battery}^1}{R_{Starter}}\right)}$$

Figure 3:
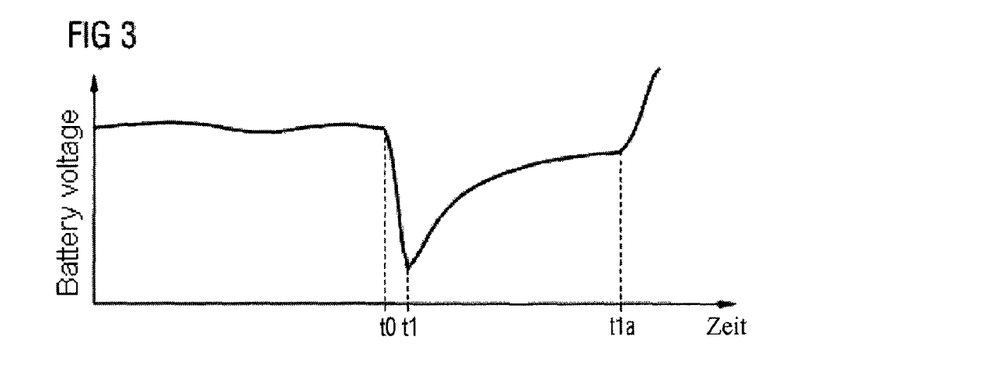
FIG. 3 is a diagram of the battery voltage plotted against the time.

FIG. 3 shows a diagram of the battery voltage plotted against time. The times t0 and t1 are virtually identical. The duration of the voltage drop is influenced essentially by the inductance of the feed lines. Between t1 and t1a the voltages $V_{Battery}^1$ and $V_{Battery}^2$ drop owing to the discharging, while at the same time the induced opposing voltage of the starter motor increases. Starting from the time t1a, the generator begins charging the battery. At the same time, at the time t1 (voltage minimum) the voltage $V_{Measurement}(t_1)$ of the A/D converter is measured.

A voltage profile $V_{Battery}(t)$ is then present at the battery between the time t1 and a later time t2. As a result, the two following differential equations for the two voltages of the battery are obtained:

$$\frac{dV_{Battery}^1(t)}{dt} = \frac{V_{Battery}(t) - V_{Battery}^1(t) - V_{Battery}^0}{R_{Battery}^1(T_{Battery}) \cdot C_{Battery}^1(T_{Battery})} - \frac{V_{Battery}^1(t) - V_{Battery}^2(t)}{R_{Battery}^2(T_{Battery}) \cdot C_{Battery}^1(T_{Battery})}$$

$$\frac{dV_{Battery}^2(t)}{dt} = \frac{V_{Battery}^1(t) - V_{Battery}^2(t)}{R_{Battery}^2(T_{Battery}) \cdot C_{Battery}^2(T_{Battery})}$$

These differential equations can be solved given knowledge of the temperature dependences. As a result, the voltages $V_{Battery}^1(t_2)$ and $V_{Battery}^2(t_2)$ can be calculated at the time t2. The predicted voltage at the time t2 is:

$$V_{predicted}(t_2) = \frac{V^1_{Battery}(t_2) + V^0_{Battery}(t_2)}{\left(1 - \frac{R^1_{Battery}(t_2)}{R_{Starter}(t_2)}\right)} + V_{Measurement}(t_1) - V_{predicted}(t_1)$$

In a further, simplified calculation method for the predicted voltage according to this formula, only its dependence on the change of specific operating parameters such as SOC, T and $V_{polarization}$ over time is taken into account. If the dependence of the modeled battery voltage on $$SOC = \left(\frac{\partial V_{Battery}}{\partial SOC}\right),$$

on the temperature $$\left(\frac{\partial V_{Battery}}{\partial T_{Battery}}\right)$$

and on the polarization voltage $$\left(\frac{\partial V_{Battery}}{\partial V_{Polarization}}\right)$$

is known at the time t1, the predicted voltage can be described as follows by means of the abovementioned expressions $V_{Battery} = V_{predicted}$ and $$V_{predicted}(t_1) = \frac{V^1_{Battery} + V^0_{Battery}}{1 - \frac{R^1_{Battery}}{R_{Starter}}} :$$

$$V_{predicted}(t_2) = V_{Measurement}(t_1) + \frac{\partial V_{Battery}}{\partial SOC}(SOC(t_2) - SOC(t_1))$$

$$\frac{\partial V_{Battery}}{\partial T_{Battery}}(T_{Battery}(t_2) - T_{Battery}(t_1))$$

$$\frac{\partial V_{Battery}}{\partial V_{Polarization}}(V_{polarization}(t_2) - V_{polarization}(t_1))$$

$V_{predicted}(t_2)$ is the expected voltage which is obtained from the model. $V_{Measurement}$ is the current measured voltage. $V_{polarization}$ is what is referred to as the polarization voltage which will be explained briefly below:

The battery voltage which, is available for use, is composed of the quiescent voltage and the polarization voltage. The quiescent voltage is present at the battery if no load is connected for at least a few hours. During operation of the battery, a load is usually connected, during which imbalances relating, for example, to the spatial ion distribution, can occur within the battery. These imbalances generate an additional voltage which is also referred to as a polarization voltage.

The model is optimized for stating processes that take place approximately 5 to 250 seconds after the switching off of the internal combustion engine, and for minimum starting voltages by approximately 6 to 8 V in the case of 12 V systems and 12 to 16 V in the case of 24 V systems.

The size and type of the battery are assumed to be unchanged after an observed starting behavior.

The changing of the battery temperature is calculated by a numerical model which takes into account both the measurement temperature and the estimated battery current.

The changing of the state of charge (SOC) is calculated by a further numerical model that takes into account the battery size and an estimated battery current. The change in the SOC can be determined by the integral of the estimated relative battery current:

$$\Delta SOC = \int_{\substack{time\ of\ last \\ starting\ process}}^{current\ time} I^{estimated}_{BAT\_relative} \cdot dt$$

The change in the polarization voltages is likewise calculated by a model that takes into account the battery voltage and battery temperature.

The battery current is estimated from the state of charge (SOC), battery voltage and battery temperature. For example, the relative battery current can be estimated from the voltage measurement as follows:

$$I^{estimated}_{BAT\_relative} = I_{Charge} + I_{Discharge}$$

$$I_{Discharge} = \begin{cases} \frac{V_{meas} - V_0^{Discharge}}{Q_{max} \cdot R_{eff}} & V_{meas} < V_0^{Discarge} \\ 0 & V_{meas} \geq V_0^{Discarge} \end{cases}$$

$$I_{Charge} = \begin{cases} \frac{V_{meas} - V_0^{Charge}}{Q_{max} \cdot R_{eff}} & V_{meas} < V_0^{Charge} \\ 0 & V_{meas} \geq V_0^{Charge} \end{cases}$$

where $$V_0^{Discharge} = 12.7\ V$$

$$V_0^{Charge} = 13.5\ V - 12\frac{mV}{K}(T - 25°\ C.)$$

Here, $Q_{max} * R_{eff}$ is a system-specific, experimentally determinable parameter. The relative battery current always refers to the maximum battery capacity $Q_{max}$. $I_{Discharge}$ and $I_{Charge}$ are the respective currents during charging and discharging with respect to the measured voltages $V_{meas}$ at the respective times. $V_{0Charge}$ and $V_{0Discharge}$ are calibration parameters which are correspondingly predefined.

The starting capability is specifically considered to be given if:
  the minimum voltage is above a limit voltage,
  the starting period is below a time limit,
  the integral of the voltage dip is below a limit over time, and
  the voltage dynamics are below a limit.

The limiting values can also depend on the configuration of the system composed of the starter and battery, on the temperature of the battery and/or of the engine as well as on the state of charge. As additional protection against non-starting, i.e. becoming stranded, the generator current can be reduced to 0 A for a certain period (for example 1 sec) before the internal combustion engine is switched off. The load current is then supplied completely from the battery for this period.

As a result of the analysis of the voltage dip, which is caused by this, the faults within the battery which have additionally occurred since the last start can be detected before the engine is switched off.

Furthermore, the sensor for measuring the voltage and temperature can have a power resistor that is generally connected parallel to the battery and therefore it presses an additional current on the battery (for example 20 mA). The period can be, for example, in a range from 1 ms to 1 hour. By evaluating the voltage response it is possible to infer the state of the battery.

The exemplary embodiment comprises an independent sensor for measuring the voltage and temperature of the battery and an algorithm that communicates at least the starting capability for start/stop systems in motor vehicles with an internal combustion engine to a superordinate control unit. The sensor can also be integrated into another control unit, into components of the battery (for example lid), or attachment components on the battery (battery cable, pole terminal, fuse box, cover cap of the positive pole).

The invention is based on the idea that the future behavior of the battery at the next engine start is predicted even without precise knowledge of the absolute or relative charge quantity or energy quantity contained in the battery. For this purpose, the behavior of the battery at at least one of the predefined engine starts is evaluated, and the expected change in this behavior is calculated in advance solely on the basis of the observed battery voltage and battery temperature over a limited time.

As a result, a clear cost saving is obtained because it is possible to dispense with measurement of the current. Furthermore, for reasons of cost the invention intentionally dispenses with determining the acid density.

The starting capability can also be predicted independently of the actual preceding starting behavior:

$$V_{predicted}(t_2) = (OCV + V_{polarization}) \frac{R_{starter}}{R_{battery} + R_{starter}}$$

However, significantly more assumptions by parameters of the battery and of the starter are necessary for this. OCV (open circuit voltage) is the quiescent voltage, that is to say the voltage which occurs after at least a few hours without a connected load. $V_{polarization}$ has already been described above and can be determined correspondingly. $R_{starter}$ is the electrical resistance to the starter and $R_{battery}$ is the electrical resistance to the battery. The resistances can be calculated or measured.

Further Exemplary Embodiments

The battery diagnosis can be made by determining the acid density.

The voltage of the battery can be fed to an existing control unit via two lines and converted into numerical values within this unit.

The voltage can be tapped, somewhere along the other side of the battery poles (for example at the end of the battery cable).

The temperature can be converted into an electrical voltage by a temperature sensor in or on the battery, fed to an existing control unit and converted into numerical values within this unit.

The battery temperature can be estimated from the ambient temperature and a model for heating and cooling can be estimated.

The sensor for measuring voltage and temperature can be integrated into the battery.

The communication can take place in a wireless fashion (for example radio).

The electrical connections can be made as a cable tail, plug-type contact or webs projecting out of the sensor.

The sensor for measuring voltage and temperature can be connected mechanically to a pole terminal (positive or negative), to a battery cable, to parts of the battery or to a component near to the battery.

Instead of a housing, a sealed encapsulation by molding or a sealed surface coating are possible.

Instead of a printed circuit board, a substrate can also be used. The electrical connection is then made by bonding.

All or some of the relevant functions (voltage supply, reference, A/D converter, µC, voltage divider, NTC etc.) can be integrated into one chip.

The battery current can be estimated from the difference between the generator current and the load current provided that both variables are available. The loading of the battery by current load current can be determined by briefly switching off the generator, wherein the battery voltage is measured and/or evaluated before, during and after the deactivation of the generator.

The starting capability can be communicated in various forms to the superordinate control unit (possible/not possible, 0 to 100%, ±50% etc.).

The algorithm can receive information from the superordinate control unit (permitted minimum starting voltage, state of the internal combustion engine, state of the terminals) or else dispense therewith.

The starting capability can also be represented optically and/or visually (in a display).

In order to calculate the starting capabilities it is additionally possible to take into account, as well as the minimum voltage, for example the duration, the dynamics and/or the required energy quantity of the starting process.

The limits of the starting capability can be fixed or variable.

In addition to the starting capability it is also possible to convey further information (state of health of the battery, optimum charging strategy etc.) to the superordinate control unit.

The sensor for measuring voltage and temperature can have more than the specified components. These include, in particular, RC filters, transistors, CAN drivers and memories. Furthermore, further functionalities can be integrated.

In particular, the sensor for measuring the voltage and temperature can have components (transistor, resistor, etc.) which impress an additional current on the battery at regular/irregular intervals.

The device according to the invention can also have an independent sensor for measuring the voltage and temperature on the battery.

As already stated, the present invention has as its subject matter a method and a device for determining the starting capability of an internal combustion engine by a starter battery, wherein in contrast to conventional methods, for reasons of cost it is possible to dispense with measuring the battery current. Instead, the battery current or the change in the charge stored in the battery is estimated by a model including measured variables (voltage and temperature of the battery) and battery parameters which are assumed to be known. Deviations from the expected behavior of the battery adversely affect the starting capability prediction.

A further configuration of the invention is advantageous, wherein plausibility checking of the battery current calculated by the model is made possible by an additional device. In this context, a further voltage is measured by a further A/D converter, specifically the voltage between a point on the vehicle body through which current flows and the negative pole of the battery. Usually both the electrical loads and the generator in the vehicle are electrically connected by their negative pole to the vehicle body, with the result that the vehicle body is part of the circuit which connects the loads and the generator to the vehicle battery. An electrical resistance is inevitably present between any point on the vehicle body and the negative pole of the battery. If the current of the electrical loads or of the generator in the vehicle then flows through the vehicle body, this resistance brings about a voltage drop between the contact point on the bodywork and the negative pole of the battery. In particular, by means of the sign of this voltage drop it is possible to detect whether the battery is being charged by the generator or discharging of the battery is occurring by loads in the vehicle.

The present invention describes an alternative solution to diagnosing the starting capability for start/stop systems, in particular of batteries based on lead and sulfuric acid. Start/stop systems are distinguished by the fact that the interval between two successive starting processes is short (stop-and-go traffic) and that during the starting process the voltage will not dip below a minimum voltage, for example 8 V, since otherwise an interruption in the operation of, for example, radio and/or navigation devices, could occur.

A prediction of the starting capability of the internal combustion engine on the basis of the present diagnosis of the vehicle battery has the advantage that compared to conventional systems it is not necessary to measure the current and accordingly the costs for measuring the current can be eliminated.

The invention is advantageously used in passenger cars and trucks.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for determining a starting capability of an internal combustion engine of a motor vehicle that is started by an electric motor supplied by a battery, comprising:
   detecting, by at least one sensor, first battery parameter values at a first time during a successful first starting process of the internal combustion engine;
   detecting, by the at least one sensor, second battery parameter values at a second time following the first time;
   determining, at the second time, by a computerized evaluation unit, based on the detected first and second battery parameter values, what a battery voltage will be during a starting process of the internal combustion engine occurring at a third time after the second time, such that the battery voltage of the third time is calculated based on a state of charge of the battery and battery temperature or change of the state of charge of the battery and change of the battery temperature;
   comparing, by the computerized evaluation unit, the determined battery voltage for the third time with a predefined threshold value;
   deriving, by the computerized evaluation unit, what a starting capability of the internal combustion engine will be at the third time based on the comparing; and
   performing control of the running of the vehicle at the second time based on the derivation of what the starting capability of the internal combustion engine will be at the third time,
   wherein if the internal combustion engine is running at the second time, the internal combustion engine is stopped at the second time only if the starting capability of the internal combustion engine will be present at the third time,
   wherein an internal combustion engine that is stopped at the second time is restarted before the third time if the starting capability of the internal combustion engine will no longer be present at the third time,
   wherein the state of charge of the battery and/or the change in the state of charge of the battery are calculated by a numerical model that takes into account the battery size and an estimated battery current, wherein the state of charge of the battery and/or the change in the state of charge of the battery is determined by the integral of an estimated battery current, wherein the estimated battery current is estimated from voltage measurements as follows:

$$I_{BAT\_relative}^{estimated} = I_{Charge} + I_{Discharge}$$

$$I_{Discharge} = \begin{cases} \dfrac{V_{meas} - V_0^{Discharge}}{Q_{max} \cdot R_{eff}} & V_{meas} < V_0^{Discharge} \\ 0 & V_{meas} \geq V_0^{Discharge} \end{cases}$$

$$I_{Charge} = \begin{cases} \dfrac{V_{meas} - V_0^{Charge}}{Q_{max} \cdot R_{eff}} & V_{meas} < V_0^{Charge} \\ 0 & V_{meas} \geq V_0^{Charge} \end{cases}$$

wherein $Q_{max}*R_{eff}$ is a system-specific, experimentally determinable parameter, and wherein $V_{0Charge}$ and $V_{0Discharge}$ are calibration parameters which are correspondingly redefined.

2. The method as claimed in claim 1, wherein the first and second parameters comprise at least one selected from the group consisting of a battery voltage and a battery temperature.

3. The method as claimed in claim 2, wherein the first and second parameters further comprise a voltage between a negative pole of the battery and a point on a vehicle bodywork through which current flow is measured.

4. The method as claimed in claim 1, wherein the at least one sensor has a power resistor connected in parallel with the battery so as to cause an additional current to be applied to the battery for a predetermined period of time such that the battery state can be inferred from the voltage response to the additional current.

5. The method as claimed in claim 1, wherein the change of state of charge of the battery is determined based on battery voltage.

6. A device for determining a starting capability of an internal combustion engine of a motor vehicle that is started by an electric motor supplied by a battery, comprising:
at least one sensor configured to:
detect first battery parameter values during a successful starting process of the internal combustion engine at a first time; and
detect second battery parameter values at a second time following the first time; and
an evaluation unit configured to:
determine, at the second time, based on the detected first and second battery parameter values what a battery voltage will be during a starting process of the internal combustion engine occurring at a third time after the second time, such that the battery voltage of the third time is calculated based on a state of charge of the battery and battery temperature or change of the state of charge of the battery and change of the battery temperature;
compare the determined battery voltage for the third time with a predefined threshold value to derive what a starting capability of the internal combustion engine will be at the third time based on the comparing; and
perform control of the running of the vehicle at the second time based on the derivation of what the starting capability of the internal combustion engine will be at the third time,
wherein if the internal combustion engine is running at the second time, the internal combustion engine is stopped at the second time only if the starting capability of the internal combustion engine will be present at the third time, and
wherein an internal combustion engine that is stopped at the second time is restarted before the third time if the starting capability of the internal combustion engine will no longer be present at the third time,
wherein the state of charge of the battery and/or the change in the state of charge of the battery are calculated by a numerical model that takes into account the battery size and an estimated battery current, wherein the state of charge of the battery and/or the change in the state of charge of the battery is determined by the integral of an estimated battery current, wherein the estimated battery current is estimated from voltage measurements as follows:

$$I_{BAT\_relative}^{estimated} = I_{Charge} + I_{Discharge}$$

$$I_{Discharge} = \begin{cases} \dfrac{V_{meas} - V_0^{Discharge}}{Q_{max} \cdot R_{eff}} & V_{meas} < V_0^{Discharge} \\ 0 & V_{meas} \geq V_0^{Discharge} \end{cases}$$

$$I_{Charge} = \begin{cases} \dfrac{V_{meas} - V_0^{Charge}}{Q_{max} \cdot R_{eff}} & V_{meas} < V_0^{Charge} \\ 0 & V_{meas} \geq V_0^{Charge} \end{cases}$$

wherein $Q_{max}*R_{eff}$ is a system-specific, experimentally determinable parameter, and wherein $V_{0charge}$ and $V_{0discharge}$ are calibration parameters which are correspondingly redefined.

7. The device as claimed in claim 6, wherein the evaluation unit is configured to actuate the at least one sensor to detect the first and second battery parameter values at the first and second times.

8. The device as claimed in claim 6, wherein the at least one sensor has a power resistor connected in parallel with the battery so as to cause an additional current to be applied to the battery for a predetermined period of time such that the battery state can be inferred from the voltage response to the additional current.

9. The device as claimed in claim 6, wherein the change of state of charge of the battery is determined based on battery voltage.

* * * * *